(12) United States Patent
Kwak

(10) Patent No.: US 7,554,375 B2
(45) Date of Patent: Jun. 30, 2009

(54) DELAY LINE CIRCUIT

(75) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/843,371

(22) Filed: Aug. 22, 2007

(65) Prior Publication Data

US 2007/0285145 A1 Dec. 13, 2007

Related U.S. Application Data

(63) Continuation of application No. 11/136,893, filed on May 25, 2005, now Pat. No. 7,276,951.

(51) Int. Cl.
*H03H 11/26* (2006.01)
(52) U.S. Cl. ...................... 327/278; 327/158
(58) Field of Classification Search .......... 327/276–278
See application file for complete search history.

(56) References Cited

U.S. PATENT DOCUMENTS

| | | | |
|---|---|---|---|
| 6,246,636 B1 * | 6/2001 | Na et al. | |
| 6,567,317 B2 * | 5/2003 | Kwak | |
| 6,573,771 B2 * | 6/2003 | Lee et al. | 327/158 |
| 6,646,939 B2 * | 11/2003 | Kwak | |
| 6,677,792 B2 * | 1/2004 | Kwak | |
| 6,687,843 B2 * | 2/2004 | Kwak | |
| 6,768,361 B2 * | 7/2004 | Kwak | |
| 6,772,359 B2 * | 8/2004 | Kwak et al. | |
| 6,775,201 B2 * | 8/2004 | Lee et al. | 365/230.04 |
| 6,825,703 B1 * | 11/2004 | Kwak | |
| 6,853,226 B2 * | 2/2005 | Kwak et al. | |
| 7,046,058 B1 * | 5/2006 | Fang et al. | 327/158 |
| 2002/0043996 A1 * | 4/2002 | Iwamoto | 327/158 |
| 2003/0219088 A1 * | 11/2003 | Kwak | |
| 2004/0201406 A1 * | 10/2004 | Lee et al. | |
| 2004/0217789 A1 * | 11/2004 | Kwak et al. | |
| 2006/0232315 A1 * | 10/2006 | Lee | 327/261 |
| 2006/0267648 A1 * | 11/2006 | Kwak | |

* cited by examiner

*Primary Examiner*—Long Nguyen
*Assistant Examiner*—Ryan C Jager
(74) *Attorney, Agent, or Firm*—Schwegman, Lundberg & Woessner, P.A.

(57) ABSTRACT

Delay circuitry is described that includes clock mixing circuitry to provide a selectable propagation time. Output signals from the mixing circuitry are selectively coupled through a variable delay line to synchronize two clock signals.

19 Claims, 9 Drawing Sheets

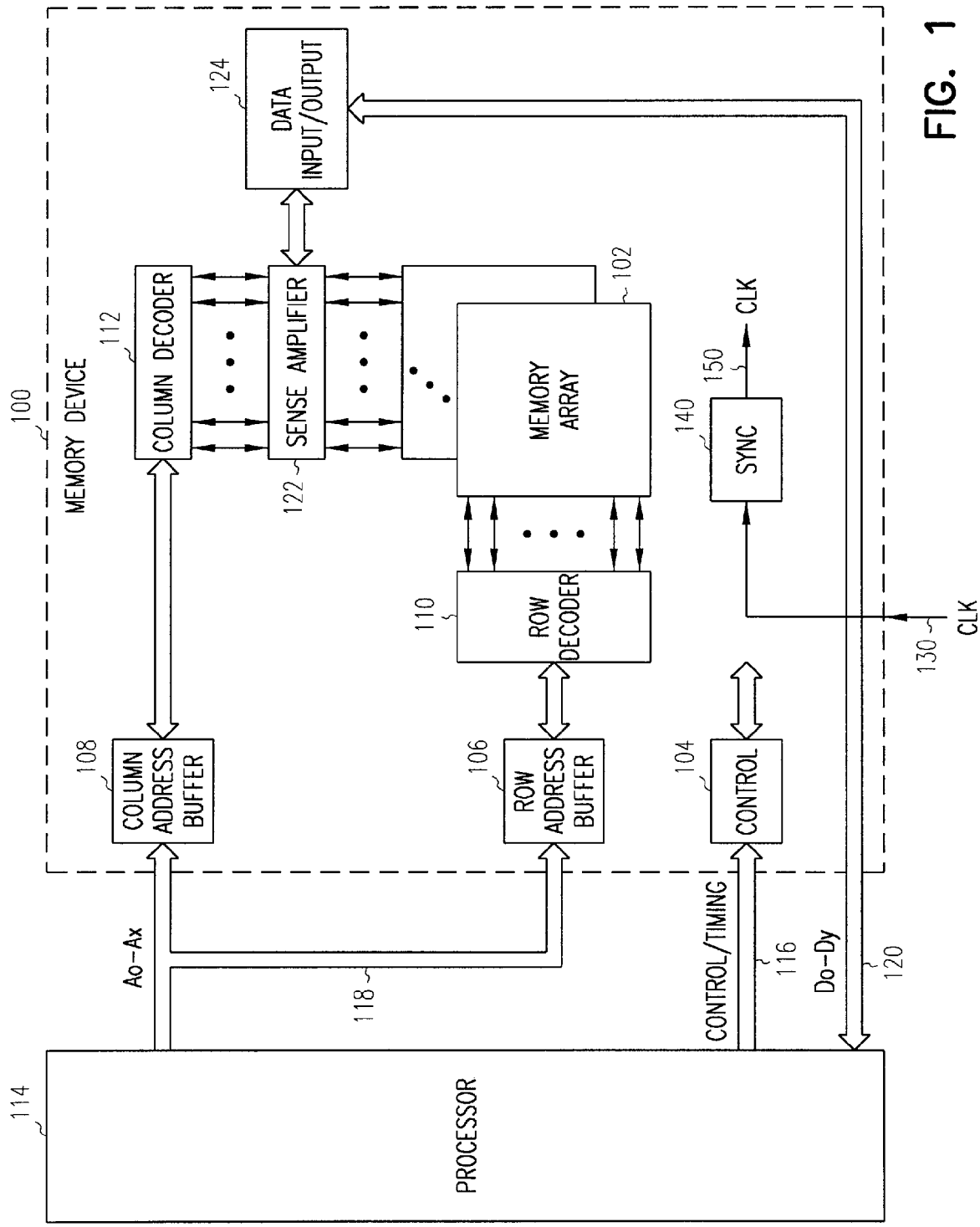

DELAY LINE CIRCUIT

CROSS REFERENCE TO RELATED APPLICATIONS

This application is a continuation of U.S. application Ser. No. 11/136,893, filed, May 25, 2005, now U.S. Pat. No. 7,276,951, which is incorporated herein by reference.

FIELD OF THE INVENTION

The present invention relates to clock signal synchronization circuits and, more particularly, to delay line circuitry used for clock signal synchronization.

BACKGROUND

Delay locked loops (DLLs) are often used in integrated circuits (ICs) to generate an internal clock signal. In a typical DLL, the internal clock signal is generated by applying an amount of delay to a system clock or an external clock signal. The DLL tracks the external and internal clock signals with a detect operation and adjusts the amount of delay with a shifting operation to keep the internal and external clock signals synchronized.

In some integrated circuit devices, such as dynamic random access memory (DRAM) devices, the internal clock signal generated by the DLL is normally used as a timing signal for certain operations of the memory device. For example, in some memory devices, the internal clock signal can be used as a clock signal to provide timing for data transfer to and from the memory device.

One type of DLL includes a variable delay line circuit having both a fine delay line and a course delay line coupled in serial. In operation, timing delay of the fine and course delay lines are adjusted and reset as needed for clock signal synchronization. These adjust and reset operations can provide undesired results in the timing of the internal clock signal.

For reasons stated below which will become apparent to those skilled in the art upon reading and understanding the present specification, there is a need for methods and devices to synchronize signals in an integrated circuit device such as a memory device.

SUMMARY

In one embodiment, a delay lock loop (DLL) circuit is provided to synchronize an internal clock signal to an external clock signal. The circuit comprises delay line units coupled in series such that an output signal of a first delay line unit is coupled to a first input node of a second delay line unit. Each of the delay line units includes a second input node. Further each delay line unit has an internal propagation signal delay time of T such that a signal on either the first or second input propagates to an output of the delay line unit in time T. A shift register enables one or more of the plurality of delay line units, and selectively enables either the first or second input nodes of the one or more of the plurality of delay units. A mixer circuit is coupled to the second input of the plurality of delay units, wherein the mixer circuit has a selectable internal propagation delay time.

In another embodiment, a delay circuit comprises a plurality of delay elements D1, D2, D3 and D4. Each delay element has first and second inputs and an output. The output of D4 is coupled to the first input of D3, the output of D3 is coupled to the first input of D2, and the output of D2 is coupled to the first input of D1. The second input of D1 and D3 are coupled to receive a first clock signal, and the second input of D2 and D4 are coupled to receive a second clock signal. Control circuitry is coupled to the plurality of delay elements to selectively enable D1, D2, D3 and D4.

A method of operating a delay line circuit includes mixing first and second clock signals to provide a third clock signal. The first clock signal is delayed from an input clock signal by one delay unit, U, and the second clock signal is delayed from the input clock signal by two delay units, 2U. The third clock signal is delayed from the input clock signal by a selectable delay between U and 2U. The third clock signal is then selectively coupled to an input of a delay line circuit.

BRIEF DESCRIPTION OF THE DRAWINGS

FIG. 1 is a block diagram of a memory device according to one embodiment of the present invention.

DESCRIPTION

Figure 2A:
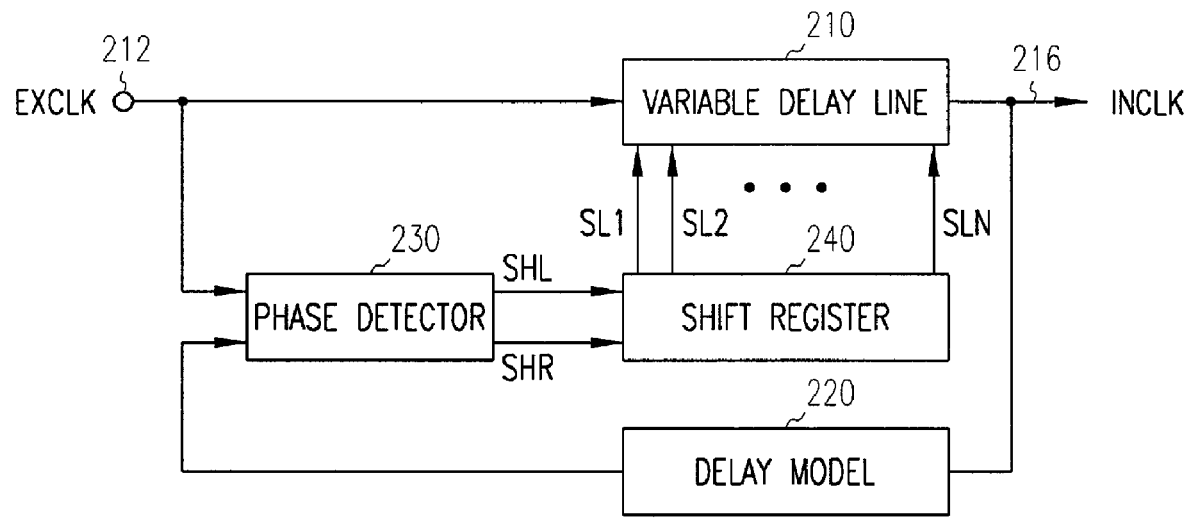
FIG. 2A is a block diagram of a prior art delay lock loop circuit.

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

Embodiments of the present description may be implemented not only within a physical circuit but also within machine-readable media. For example, the circuits and designs discussed herein may be stored upon and/or embedded within machine-readable media associated with a design tool used for designing semiconductor devices. Examples include netlist files or other machine-readable media for semiconductor design which may be used in a simulation environment to perform the methods of the teachings described herein. The following detailed description is, therefore, not to be taken in a limiting sense, and the scope of the present invention is defined only by the appended claims, along with the full scope of equivalents to which such claims are entitled.

Embodiments of the present invention can include a semiconductor memory device having an array of memory cells. The memory cells can be volatile or non-volatile. For example, a DRAM typically implements charge storage cells, such as trench or container capacitors. Non-volatile memory cells can be charge trapping cells such as floating gate transistors or NROM cells, phase-change memory cells such as chalcogenide cells, programmable conductor random access memory (PCRAM), latching cells such as SRAM, magnetic random access memories (MRAM's), or one-time programmable cells such as ROM cells. In addition, the memory cells can store one or more data bits per cell.

FIG. 1 is a simplified block diagram of an integrated circuit dynamic memory device 100 in accordance with an embodiment of the invention. The memory device 100 includes an array of dynamic memory cells 102, an address decoder 104, row access circuitry 106, column access circuitry 108, control circuitry 110, and Input/Output (I/O) circuitry 112.

The memory device 100 can be coupled to a processor 114 or other memory controller for accessing the memory array 102. The memory device 100 coupled to a processor 114 forms part of an electronic system. Some examples of electronic systems include personal computers, peripheral devices, wireless devices, digital cameras, personal digital assistants (PDA's) and audio recorders.

The memory device 100 receives control signals across control lines 116 from the processor 114 to control access to the memory array 102 via control circuitry 104. Access to the memory array 102 is directed to one or more target memory cells in response to address signals received across address lines 118. Row address buffer 106 in combination with row decoder 110 access one or more rows of the array. Likewise, column address buffer 108 in combination with column decoder 112 access one or more columns of the array. Once accessed in response to the control signals and the address signals, data is written to or read from the memory cells across data, DQ, lines 120. Data I/O circuitry 124 and sense amplifier circuitry 122 are used to read and write data to the array.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

One embodiment of the invention is a synchronous memory device having an internal clock generator. As known to those skilled in the art, synchronizing the internal clock signal 150 to an externally provided clock 130 is performed using a clock synchronization circuit 140. One type of synchronous circuit is a delay lock loop (DLL) circuits used to compensate for timing skew between the external clock signal and an internal clock signal.

Figure 2B:
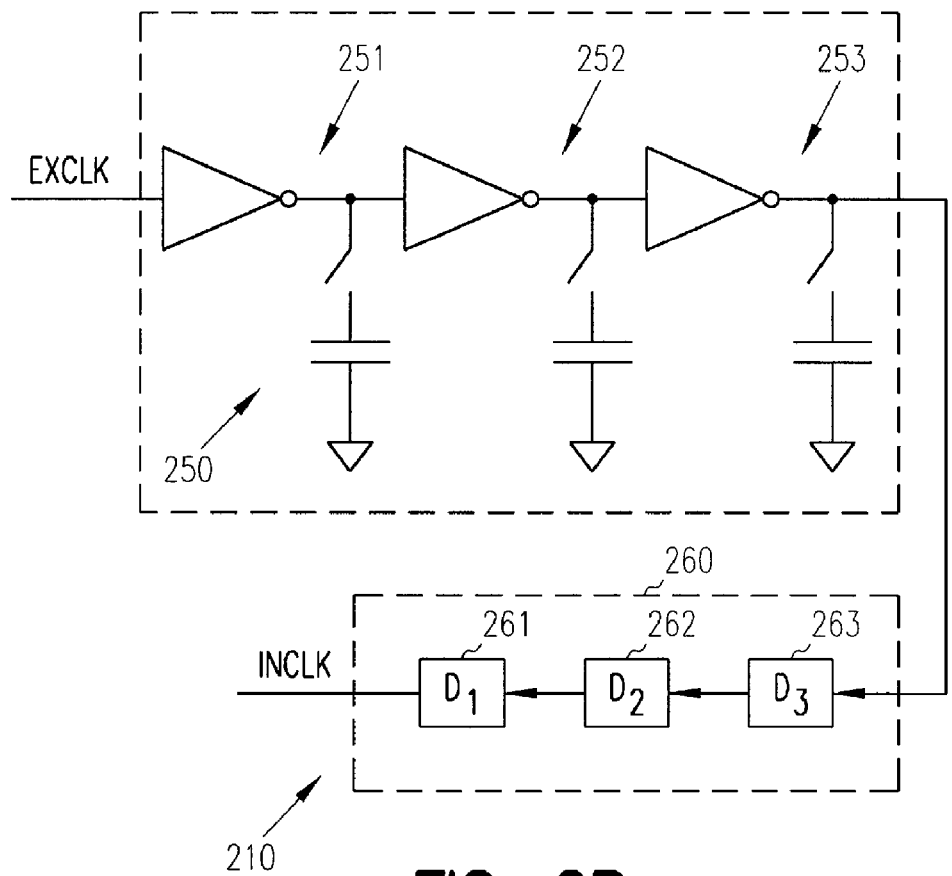
FIG. 2B illustrates a prior art variable delay line circuit.

Referring to FIGS. 2A and 2B, a simplified block diagram of a conventional clock synchronization circuit includes a variable delay line 210 to delay an external clock signal 212 for a selectable time and to generate an internal clock signal 216 as an output of the variable delay line. A phase detector 230 is provided to compare a phase difference between the external clock signal and the internal clock signal. The phase detector is used to control a shift register 240 which in turn controls the delay line circuitry to establish the selectable time. A delay model circuit 220 is provided to offset delays of support circuitry in the clock propagation path.

The variable delay line circuit 210 includes a fine delay line 250 and a course delay line 260 coupled in serial. Each of the fine and course delays has several selectable delay units that determine the overall time delay of the delay line. During one example operation one unit of the course delay is selected by shift register. If additional delay is desired to synchronize clock signals, one or more of the fine delay units is coupled into the delay path. When all available fine delay units have been selected, an additional course delay unit will be selected by shift register 240 to increment the overall delay path through the variable delay line. The fine delay units need to be reset when selecting an additional course delay unit. Timing this reset can be difficult and result in a 'boundary' switching problem adding to circuit jitter.

Referring to FIG. 2B, in an example operation course delay unit 261 is initially selected. In response to the phase detect circuit additional delay is added by selecting fine delay units 250, 251 and 253. Each fine delay circuit has a propagation time that is one-third the propagation time of a course delay circuit. If additional delay is needed, fine delay units 251, 252 and 253 are reset and course delay units 261 and 262 are selected. This 'boundary' between resetting the fine units and selecting an additional course unit can be difficult to control. That is, the overall delay path may temporarily include the fine delay units until the reset is complete. As explained herein, embodiments of the invention provide phase mixing to address some issues with the boundary switching.

Figure 3:
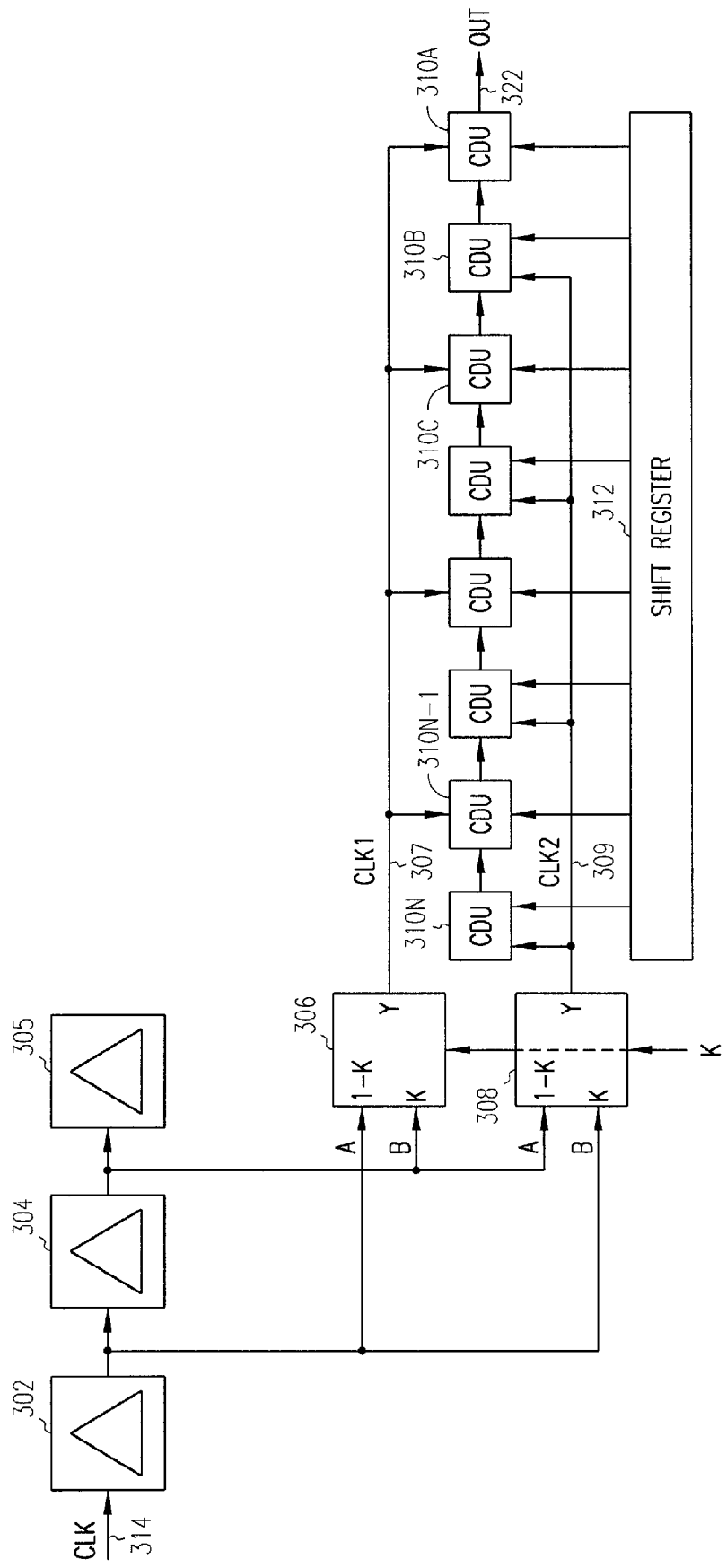
FIG. 3 illustrates a delay circuit according to one embodiment of the present invention.

Referring to FIG. 3, a block diagram of an embodiment of a delay circuit is described. The circuit includes initial delay units 302 and 304 coupled through mixer circuits 306 and 308. A delay unit 305 can be provided to maintain a load on unit 304 comparable to the load on unit 302. The outputs of the mixer circuits provide clocking inputs for delay line units 310a-310n. Shift register 312 selects one or more delay units 310a-310n.

In one embodiment, the output 307 of phase mixer circuits 306 is: Y=A*(1−K)+B*K, where K is a control. That is, when K=0 the output of the phase mixer is A and when K=1 the output is B. A value between 0 and 1 provides an output having a mix of A and B. It is noted that the embodiment illustrated in FIG. 3 the mixer circuits inputs, A and B, are reversed. As such, the output 309 of phase mixer circuits 308 is: Y=B*(1−K)+A*K, where K is the control. That is, when K=0 the output of the phase mixer is B and when K=1 the output is A. A value between 0 and 1 provides an output having a mix of A and B.

The output of delay unit 302 is one unit delay from clock input 314 and the output of delay 304 is two unit delays from clock input 314. Input A of the mixer circuits is coupled to the output of initial delay unit 302 and Input B of the mixer circuits is coupled to the output of initial delay unit 304. The output of mixer 306 is coupled to the clock input of the odd delay stages 310a-(n−1) and the output of mixer 308 is coupled to the clock input of the even delay stages 310b-n.

In operation, assuming all delay units are equal, delay unit 310a is selected by shift register 312 and K is set to a zero value. As such, the input to delay unit 310 a is Y=A from mixer 306. Because the A input is coupled to initial delay unit 302 the overall delay between input 314 and output 322 is two delay units (302 and 310a). If additional delay is needed K is selectively increased toward a value of one. For example increasing K to 0.25 provides a delay through mixer 302 of 0.75A+0.25B. The overall delay is therefore 0.75+0.25*2U+ (delay 310a), or 2.25 units. It will be appreciated that increasing K to 1 provides an overall delay of 3 units.

If an additional time delay above 3 delay units is needed to synchronize clock signals, the shift register is adjusted to select delay unit 310b as the start of the delay line path. The input to delay 310b is output 309 of mixer circuit 308. Because K is currently set to a value of one, the mixer output is A, or the signal delay through unit 302. The input to delay 310a is changed from output 307 to the output of delay circuit 310b (explained below). The overall delay is therefore three delay units. It will be appreciated that switching the additional delay unit 310b into the delay path did not create a boundary transition step or the need to reset a fine delay circuit. To add additional delay to the propagation time for synchronization, K is decreased from a value of one to a value of zero. Until the overall delay is four units, at that point delay 310c can be selected by the shift register and the above process repeated.

Referring to FIGS. 4-8 a more detailed description of one possible embodiment of the invention is provided. As shown in FIGS. 4A and 4B, the external clock signal input 400 is coupled to delay unit 402, which is coupled to delay unit 404. Both delay units 402 and 404 are coupled to mixer circuits 406 and 408. A weight factor (K) circuit 409 is coupled to both mixing circuits to control the mixer output formula. Mixer circuit 406 is coupled to odd delay units 410a-410 (n−1). Similarly mixer circuit 408 is coupled to even delay units 410b-410n. A shift register 412 is provided to control propagation paths through the delay units 410a-n in response to shift right signal (SR*) and Shift left signal (SL*) from phase detector circuit 413. An optional delay stage 411 can be provided for increased timing margin of the delay line.

Figure 4A:
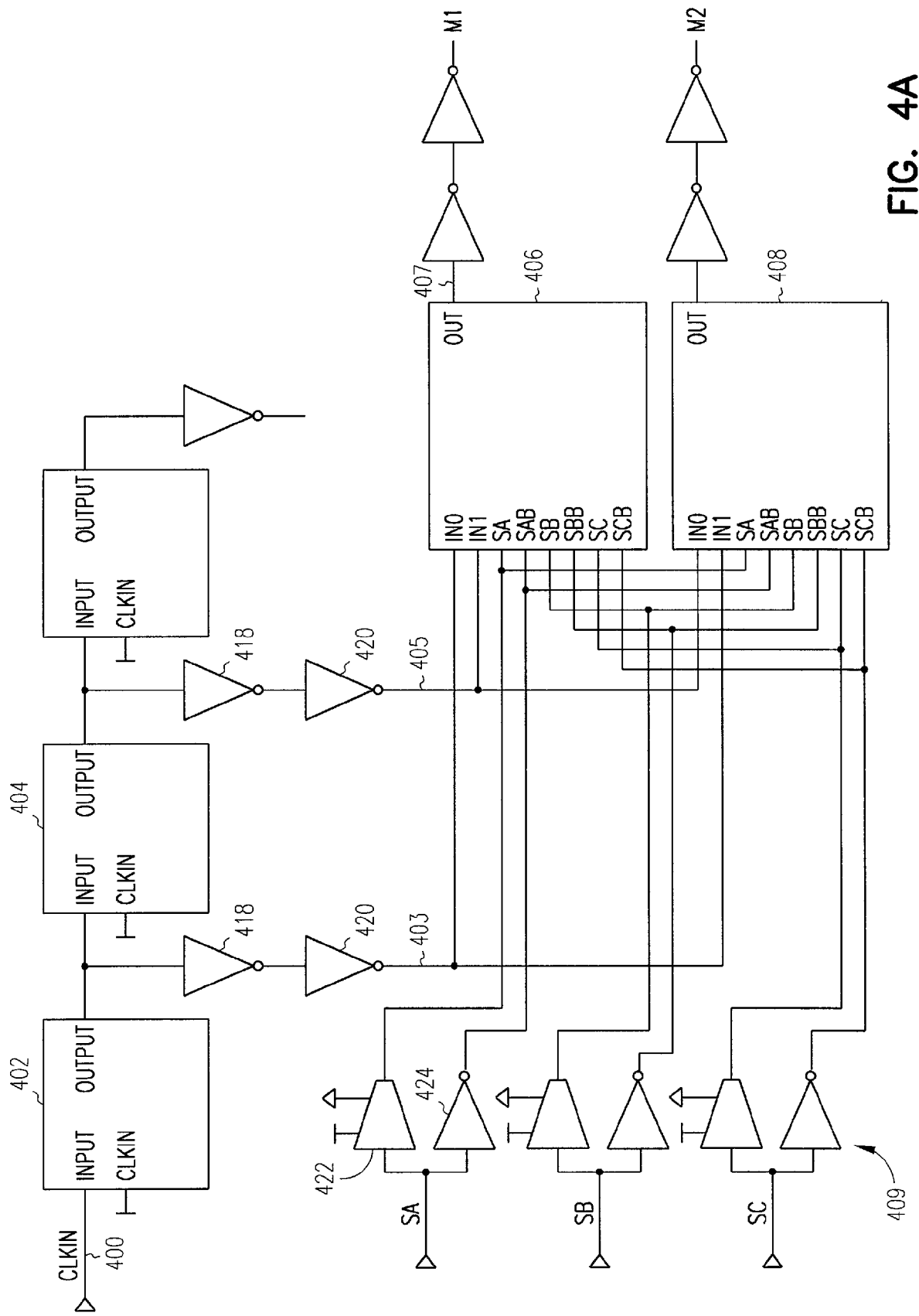
FIGS. 4A and 4B are a more detailed illustration of a delay circuit according to one embodiment of the present invention.

The schematic diagram of FIG. 4A illustrates optional components that are not be needed for implementing embodiments of the invention. For example, inverter circuits 418 and 420 are provided for assisting signal timing between delay units 402 and 404 and the input of mixer circuits 406 and 408. Similarly, delay circuits 422 are provided to match a propagation time through inverter 424. As such, circuit elements can be added to or removed from embodiments of the invention to try to optimize implementations for specific applications without departing from the disclosed invention.

Figure 5:
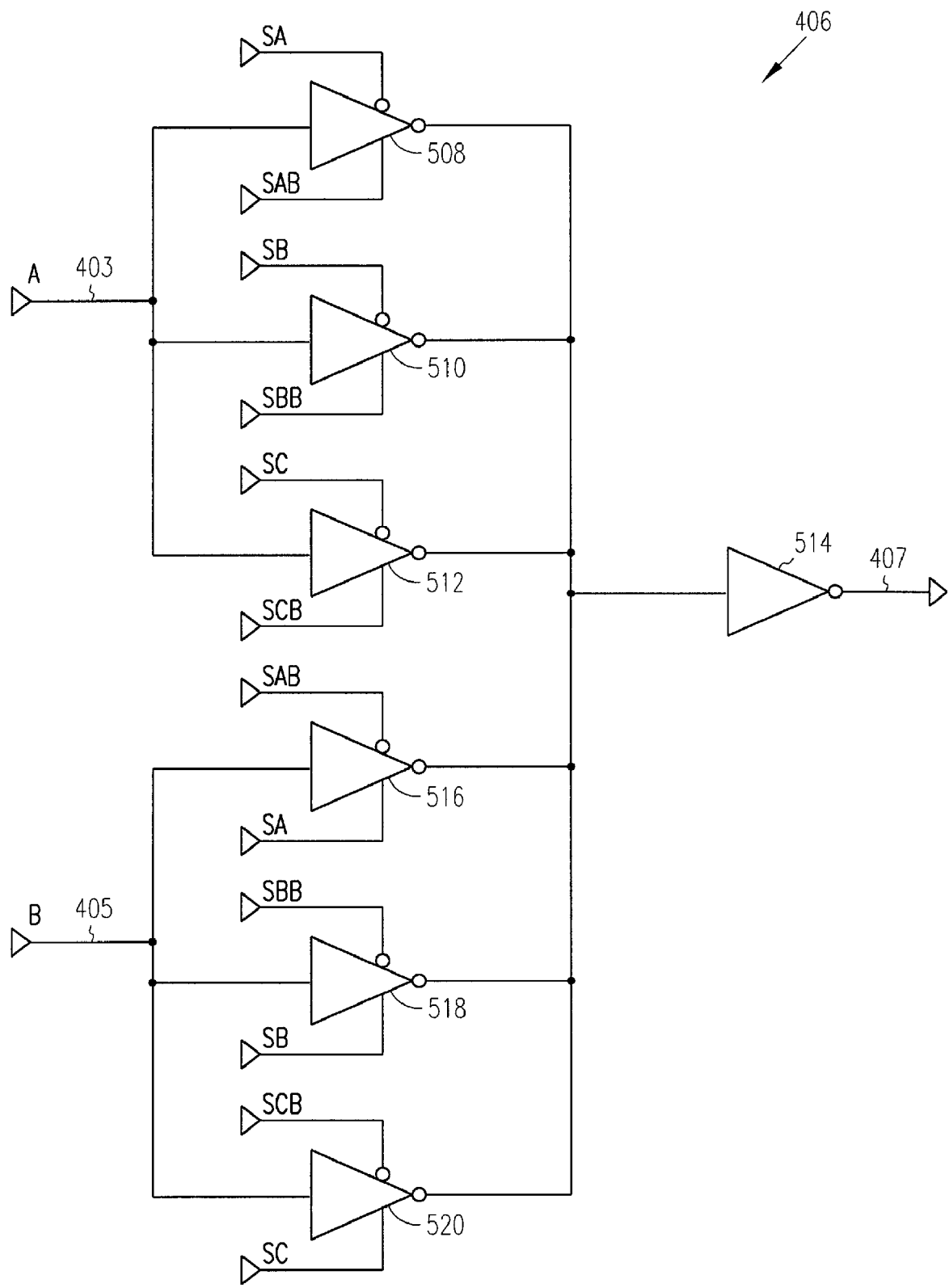
FIG. 5 is a detailed schematic diagram of a mixer circuit according to one embodiment of the present invention.

Three signals, SA, SB and SC are provided to control mixer circuits 406 and 408. Delay element 422 and inverters 424 provide both inverted and non-inverted SA, SB and SC signals to the mixers. Referring to FIG. 5 an embodiment of the mixer circuit 406 is described in greater detail. Delay mixer circuit 406 includes input A 403 and input B 405. Input A is coupled to output 407 through parallel coupled inverters 508, 510 and 512 and inverter 514. Similarly, input B is coupled to output 407 through parallel coupled inverters 516, 518 and 520 and inverter 514. The K value (weight factor) described above and signals SA, SB and SC are illustrated in Table 1.

TABLE 1

| K | SA | SB | SC | sa | sab | sb | sbb | sc | scb |
|---|----|----|----|----|-----|----|-----|----|-----|
| 0 | 0 | 0 | 0 | 0 | 1 | 0 | 1 | 0 | 1 |
| 1/3 | 0 | 0 | 1 | 0 | 1 | 0 | 1 | 1 | 0 |
| 2/3 | 0 | 1 | 1 | 0 | 1 | 1 | 0 | 1 | 0 |
| 1 | 1 | 1 | 1 | 1 | 0 | 1 | 0 | 1 | 0 |

In operation, parallel coupled inverters 508, 510 and 512 couple a signal on input A to inverter 514 in response to SA, SB and SC. That is, when SA, SB and SC are 0,0,0 all three inverters are enabled. When SA, SB and SC are 0,1,1 inverter 508 is active and inverters 510 and 512 are disabled. Likewise when SA, SB and SC are 1,1,1 all of the inverters are disabled. Parallel coupled inverters 516, 518 and 520 are coupled to signals SA, SB and SC in an inverse manner. That is, when SA, SB and SC are 0,0,0 the inverters are disabled and when the signals are 1,1,1 the inverters are all enabled. Each inverter includes a pull-up and pull-down transistor. By activating multiple parallel inverters simultaneously, the pull-up and pull-down speed is increased, as explained with reference to FIG. 6.

Figure 6:
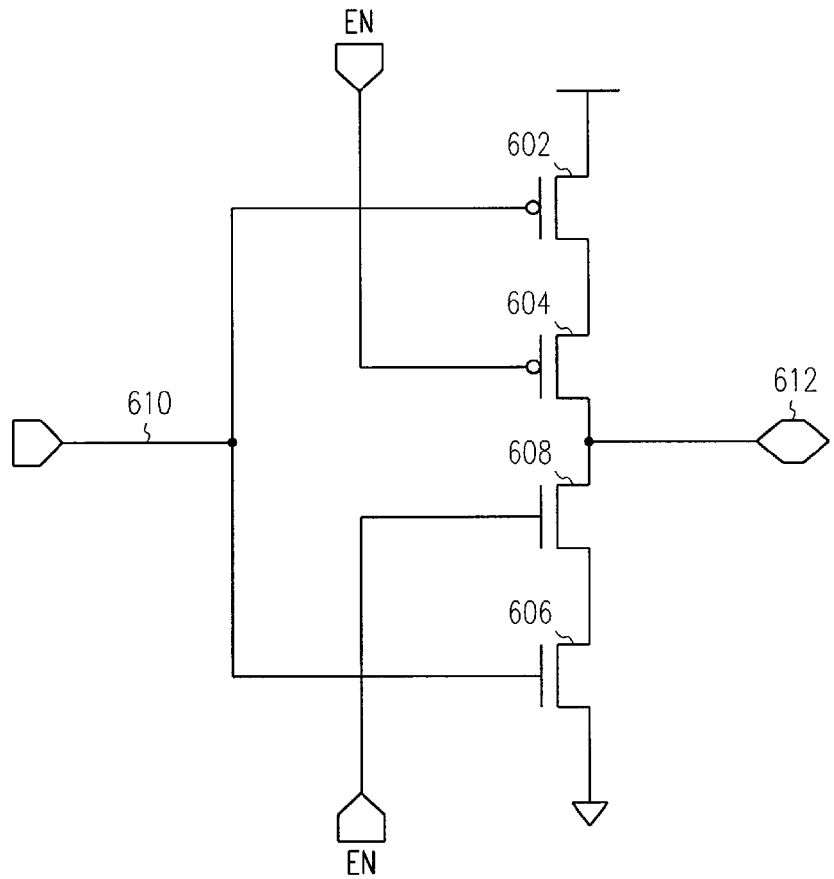
FIG. 6 is a detailed schematic diagram of an inverter circuit according to one embodiment of the present invention.

FIG. 6 illustrates one embodiment of inverters 508-512 and 516-520 of FIG. 5. Each inverter includes a pull-up transistor 602, a pull-up enable transistor 604, a pull-down transistor 606 and a pull-down enable transistor 608. An input signal on node 610 controls activation of transistors 602 and 606. Likewise, enable and enable* nodes control the activation of enable transistor 604 and 608. When the enable transistors 604 and 608 are activated, an input signal on node 610 is inverted to node 612. As known to those skilled in the art the 'size' of the transistors has a direct correlation to the pull-up and pull-down speed of the inverter. Further, parallel activated transistors can effectively increase an equivalent size of a single transistor.

Referring back to FIG. 5, by controlling the enable signals for inverters 508-512 and 516-520 the pull-up and pull-down speeds of the input to inverter 514 are controlled. One skilled in the art can see from the present description that the propagation time through the mixer is a combination of input signals A and B. The number of mix steps is determined by the number of parallel coupled inverters in each circuit leg between an input and the mixer output. The present invention is not limited to three inverters, but can be increased or decreased. It is noted that increasing the number of inverters requires an increase in control signals coupled from the weight factor circuitry.

Figure 7:
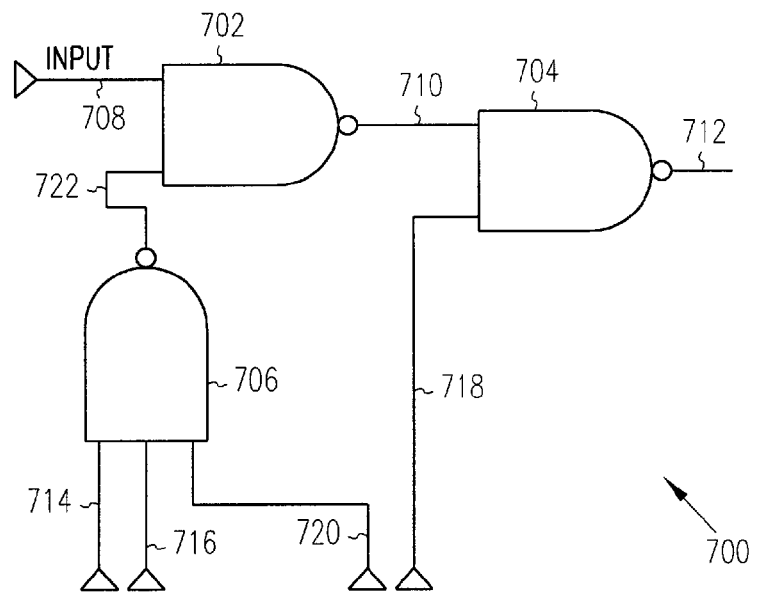
FIG. 7 is a detailed schematic diagram of a delay circuit according to one embodiment of the present invention.

Referring to FIG. 7 one embodiment of a delay unit 700 that can be used for delay units 410a-n is described. The delay unit 700 includes NAND circuits 702, 704 and 706. NAND 702 is coupled to an input node 708 and an output coupled to node 710. Input node 708 is used to propagate an output from a prior delay unit. The output node 712 of NAND 704 provides the clock output signal for the delay unit 700. Node 714 of NAND 706 is coupled to an output signal M1 or M2 from one of the mixer circuits 406 and 408. Nodes 716, 718 and 720 are coupled to the shift register for activating and selecting either input node 708 or 714 to couple to output 712.

In operation, the delay unit can have three operation states, deactivated, propagation leader and propagation stage. When deactivated the delay unit maintains a high signal level on its output. Operating as a propagation leader the delay unit propagates an output from a mixer circuit to the delay unit's output. Operating as a propagation stage the delay unit propagates an output from a prior delay unit to its output.

The delay unit is deactivated when a voltage on node 718 is at a low voltage level. This maintains a high signal voltage on output 712. It is noted that a high output voltage from a prior delay unit will pull node 708 to a high state.

To operate the delay unit as a propagation leader, voltages on nodes 716, 718 and 720 are pulled to a high state. Note that node 708 will be at a high state from either a prior delay unit or it is tied high depending upon its location in the delay line. As such, a voltage level on node 714 is inversely coupled to node 722 which is inversely coupled to node 710 and again inversely coupled to output node 712. The output signal from mix circuitry is therefore propagated through the delay unit.

To operate the delay unit as a propagation stage, a voltage on node 718 is pulled to a high level and node 716 is pulled to a low level. Node 720 can also be pulled low. As such, node 722 is at a high voltage level and a signal on node 708 propagates through NANDs 702 and 704 to output 712.

Figure 4B:
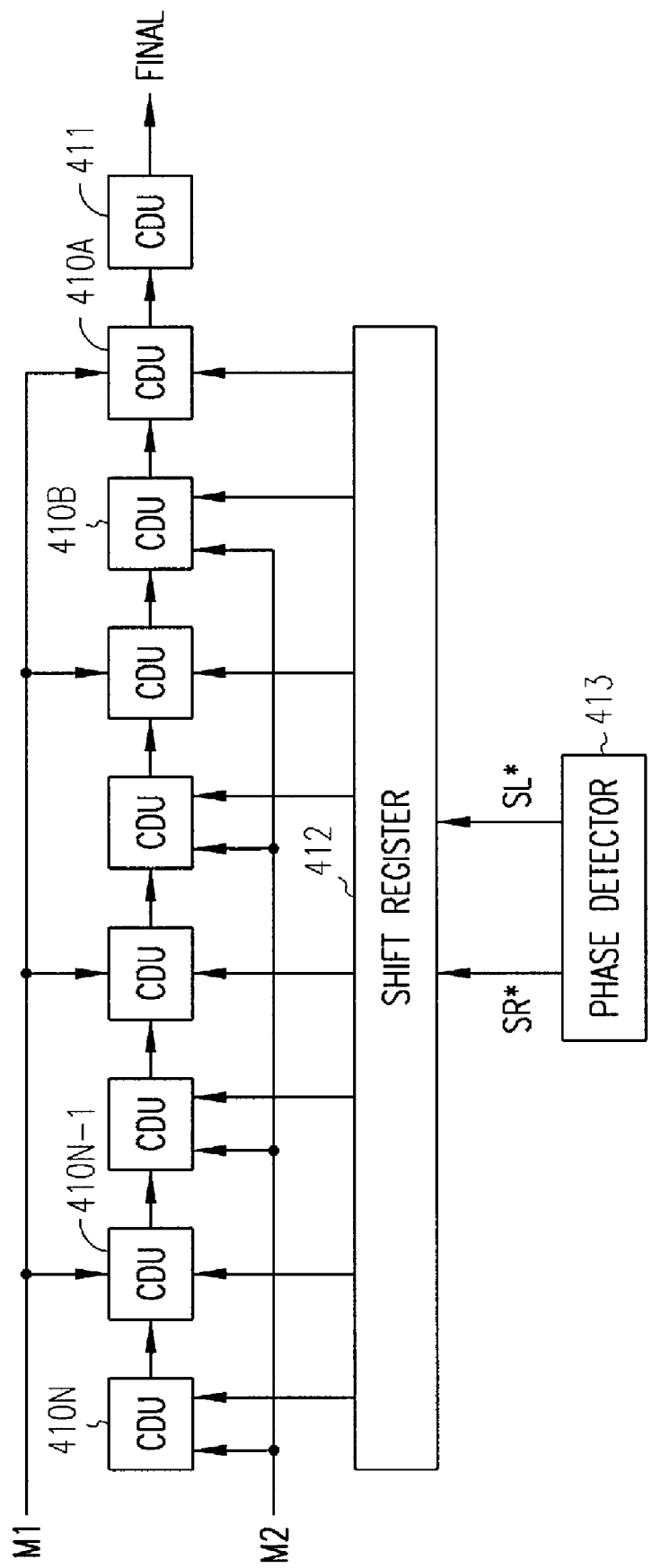
Figure 8A:
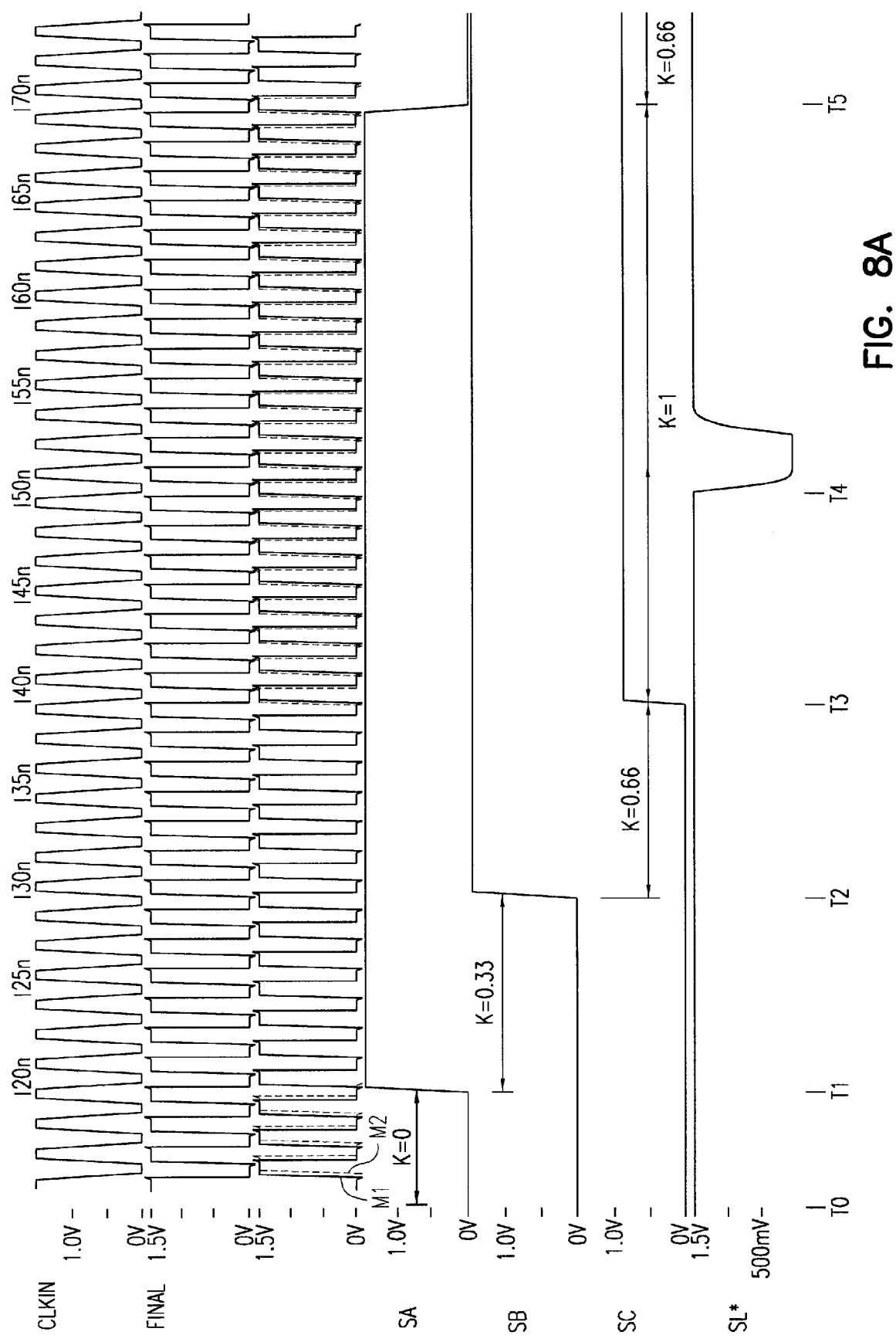
FIG. 8A is a timing diagram of the delay circuit of FIGS. 4A and 4B.
Figure 8B:
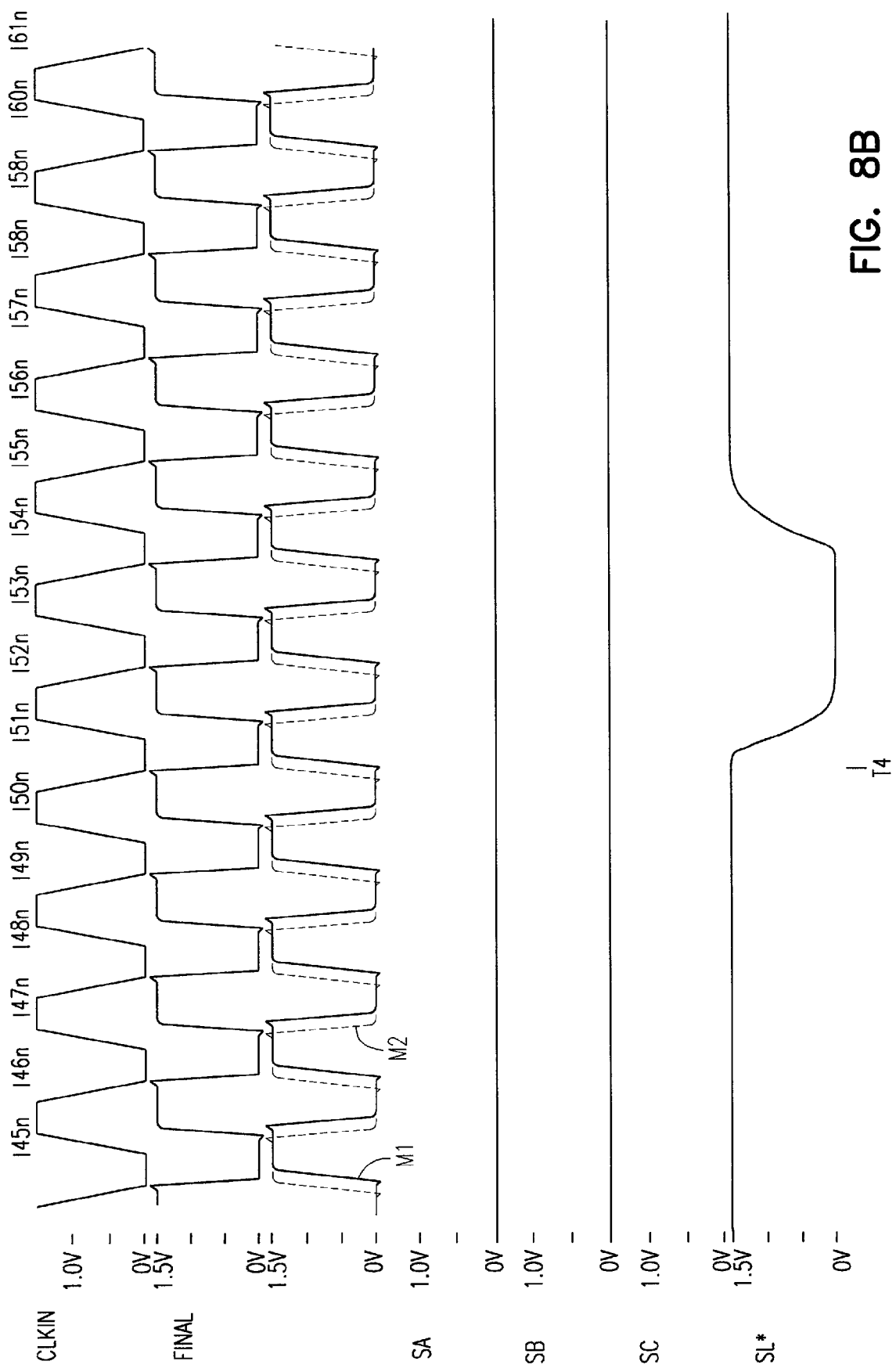
FIG. 8B is an enlarged view of a portion of FIG. 8A.

The timing diagram of FIGS. 8A and 8B is explained with reference to FIGS. 4A and 4B. Signal CLKIN 400 is the input clock signal to delay unit 402, FINAL is the output clock signal of delay unit 411, M1 is the output signal of mixer circuit 406, M2 is the output signal of mixer circuit 408, and SL* is a shift left control signal for the shift register. At time T0 control signals SA, SB and SC are low such that K is 0. M1 therefore is one delay unit behind CLKIN and FINAL is three delay units behind CLKIN. At time T1 SA transitions to a high level to transition the weight value to K=0.33. The M1 signal therefore is 1.33 delay units behind the CLKIN signal and the FINAL clock signal is 3.33 delay units behind CLKIN. At time T2 SB transitions to a high state to change the weight factor to K=0.66. The M1 signal therefore is 1.66 delay units behind the CLKIN signal and the FINAL clock signal is 3.66 delay units behind CLKIN. At time T3 SC transitions to a high level to change the weight factor to K=1. The M1 signal therefore is 2 delay units behind the CLKIN signal and the FINAL clock signal is 4 delay units behind CLKIN. At time T4 the shift register is shifted left by a voltage pulse on SL*. FIG. 8B is an enlarged view of the diagram of FIG. 8A at time T4. With the weight factor at K=1 the FINAL clock signal is maintained at 4 delay units behind the CLKIN signal. It is noted that the FINAL signal does not experience jitter during shift register transitions. At time T5 SA goes low to change K to 0.66 and increase the overall delay.

What is claimed is:

1. A delay locked loop, comprising:
a first initial delay unit that receives an external clock signal and is configured to generate a first time delayed signal from the external clock signal;
a second initial delay unit that receives the first time delayed signal and is configured to generate a second time delayed signal from the first time delayed signal;
a first mixing unit that receives the first time delayed signal and the second time delayed signal and is configured to generate a first mixed output signal based upon the first time delayed signal and the second time delayed signal, wherein an internal propagation time of the first mixing unit is controlled based upon a value of a weight parameter;
a second mixing unit that receives the first time delayed signal and the second time delayed signal and is configured to generate a second mixed output signal based upon the first time delayed signal and the second time delayed signal, wherein an internal propagation time of the second mixing unit is controlled based upon the value of the weight value;
a plurality of serially-coupled delay line units, each of the plurality of delay line units including first and second input nodes, wherein the second input node is coupled to receive either the first or second mixed output signal; and
a shift register unit that selectively enables the delay line units.

2. The delay locked loop of claim 1, comprising a weight factor unit that is configured to provide the weight factor to the first mixing unit and the second mixing unit.

3. The delay locked loop of claim 2, wherein the weight factor unit is configured to generate a weight factor that varies between a value between zero and one.

4. The delay locked loop of claim 3, wherein the first mixing unit and the second mixing unit generate outputs that linearly vary in relation to the first time delayed signal and the second time delayed signal.

5. The delay locked loop of claim 4, wherein the first mixing unit and the second mixing unit respectively generate inverse propagation times.

6. The delay locked loop of claim 1, comprising a third initial delay unit coupled to the second initial delay unit to maintain a suitable load on the second initial delay unit.

7. The delay locked loop of claim 1 wherein at least one of the first mixing unit and the second mixing unit comprise:
a first parallel coupled inverter unit positioned between a first input and an output of the at least one of the first mixing unit and the second mixing unit; and
a second parallel coupled inverter unit positioned between a second input and an output of the at least one of the first mixing unit and the second mixing unit; wherein the first and second parallel coupled inverter units alter a propagation time of the first and second parallel coupled inverters.

8. A method of operating a delay line circuit comprising:
mixing first and second clock signals to provide a third clock signal, wherein the first clock signal is delayed from an input clock signal by one delay unit, U, the second clock signal is delayed from the input clock signal by two delay units, 2U, and the third clock signal is controllably delayed from the first clock signal by a selectable delay that varies between U and 2U;
mixing the first and the second clock signals to provide a fourth clock signal, wherein the fourth clock signal is delayed relative to the first clock signal by a selectable delay that varies between 2U and U; and
selectively coupling the third clock signal and the fourth clock signal to an input of a delay line circuit.

9. The method of claim 8 wherein mixing the first and second clock signals comprises selectively controlling parallel coupled inverter circuits.

10. The method of claim 8, wherein mixing first and second clock signals to provide a third clock signal comprises introducing a weight factor that varies between zero and one, and wherein the third clock signal comprises a linear combination of the weight factor and the first clock signal and the second clock signal.

11. The method of claim 8, wherein selectively coupling the third clock signal to an input of a delay line circuit comprises selectively enabling elements of the delay line circuit using a shift register.

12. The method of claim 11, wherein selectively enabling elements of the delay line circuit using a shift register comprises providing suitable control signals to the shift register using a phase detector that is at least responsive to the first clock signal.

13. A method of operating a delay line circuit comprising:
providing a first clock signal delayed from an input clock signal by a time T;
providing a second clock signal delayed from the input clock signal by a time 2T;
combining the first and second clock signals to generate a third clock signal and a fourth clock signal, wherein the third clock signal differs from the input clock signal by a selectable delay that is between T and 2T, and the fourth clock signal differs by a selectable delay that is between 2T and T, wherein the third and fourth clock signals have inversed delay times such that the third clock signal is delayed from the fourth clock signal by a time T when the fourth clock signal is delayed from the input clock signal by a time 2T; and
selectively coupling the third or fourth clock signals to a plurality of series coupled delay elements.

14. The method of claim 13, wherein providing a first clock signal comprises providing a first clock signal that is proportional to a weight factor that varies between zero and one, and a time delayed value of the input clock signal.

15. The method of claim 13, wherein providing a second clock signal comprises providing a first clock signal that is proportional to a weight factor that varies between zero and one, and a time delayed value of the input clock signal.

16. The method of claim 13, wherein selectively coupling either the third or fourth clock signals through a plurality of series coupled delay elements comprises selectively enabling elements of the delay line circuit using a shift register.

17. The method of claim 16, wherein selectively enabling elements of the delay line circuit using a shift register comprises receiving control signals from a phase detector that is responsive to at least the input clock signal.

18. A delay locked loop, comprising:
a plurality of serially-coupled delay elements, each delay element having a first input, a second input and an output so that outputs from odd-numbered delay elements are coupled to first inputs of even-numbered delay elements;
a first mixing unit operable to generate a first clock signal and coupled to the second input of odd-numbered delay elements;
a second mixing unit operable to generate a second clock signal and coupled to the second input of the even-numbered delay elements, wherein the first mixing unit and the second mixing unit are configured to receive a weight factor that varies between zero and one, and to generate respective first and second clock signals based upon the received value of the weight factor; and
a shift register coupled to the plurality of delay elements to selectively enable the delay elements.

19. The delay locked loop of claim 18, wherein the first mixing unit and the second mixing unit are configured to generate first and second clock signals that are proportional to the weight factor.

* * * * *